(12) United States Patent
Kasuga et al.

(10) Patent No.: US 12,342,457 B2
(45) Date of Patent: Jun. 24, 2025

(54) WIRING BOARD AND MANUFACTURING METHOD OF WIRING BOARD

(71) Applicant: SHINKO ELECTRIC INDUSTRIES CO., LTD., Nagano (JP)

(72) Inventors: Takashi Kasuga, Nagano (JP); Tomoyuki Shimodaira, Nagano (JP); Hikaru Tanaka, Nagano (JP); Naotaka Noguchi, Nagano (JP); Takashi Sato, Nagano (JP); Hitoshi Kondo, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 295 days.

(21) Appl. No.: 17/947,489

(22) Filed: Sep. 19, 2022

(65) Prior Publication Data

US 2023/0089948 A1    Mar. 23, 2023

(30) Foreign Application Priority Data

Sep. 22, 2021    (JP) ................... 2021-154067

(51) Int. Cl.
| | |
|---|---|
| H05K 1/11 | (2006.01) |
| H05K 1/18 | (2006.01) |
| H05K 3/40 | (2006.01) |
| H05K 3/46 | (2006.01) |

(52) U.S. Cl.
CPC ..... *H05K 1/115* (2013.01); *H05K 2201/0338* (2013.01); *H05K 2201/09563* (2013.01)

(58) Field of Classification Search
CPC ........ H05K 1/115; H05K 1/181; H05K 1/113; H05K 1/116; H05K 2201/0338; H05K 2201/09563; H05K 3/4007; H05K 3/4661
See application file for complete search history.

(56) References Cited

U.S. PATENT DOCUMENTS

| | | | | |
|---|---|---|---|---|
| 2014/0353025 A1* | 12/2014 | Jang | ....................... | H05K 3/421 |
| | | | | 29/829 |
| 2015/0250054 A1* | 9/2015 | Yoshikawa | ........... | H01L 25/105 |
| | | | | 361/767 |
| 2023/0209725 A1* | 6/2023 | Toba | ................. | H01L 23/49822 |

FOREIGN PATENT DOCUMENTS

| | | |
|---|---|---|
| JP | 10-4272 A | 1/1998 |
| JP | 2000-244127 | 9/2000 |
| JP | 2001-177165 A | 6/2001 |

(Continued)

OTHER PUBLICATIONS

Japanese Office Action dated Nov. 26, 2024, Application No. 2021-154067; English translation included, 11 pages.

(Continued)

*Primary Examiner* — Timothy J Thompson
*Assistant Examiner* — Amol H Patel
(74) *Attorney, Agent, or Firm* — Rankin, Hill & Clark LLP

(57) ABSTRACT

A wiring board includes: a wiring layer; an insulating layer laminated on the wiring layer; an opening portion penetrating through the insulating layer to the wiring layer; a recess portion formed in a surface of the wiring layer exposed from the opening portion of the insulating layer; and a conductor film formed in the opening portion of the insulating layer and the recess portion of the wiring layer, wherein the recess portion of the wiring layer includes a raised portion, which is raised higher than an outer peripheral portion of a bottom surface, at a central portion of the bottom surface.

20 Claims, 18 Drawing Sheets

(56) References Cited

FOREIGN PATENT DOCUMENTS

| | | |
|---|---|---|
| JP | 2003-133736 A | 5/2003 |
| JP | 2010-10639 A | 1/2010 |
| JP | 2014-232862 A | 12/2014 |

OTHER PUBLICATIONS

Japanese Decision to Grant a Patent issued Mar. 11, 2025 in the corresponding Japanese application No. 2021-154067; English translation included (3 pages).

\* cited by examiner

WIRING BOARD AND MANUFACTURING METHOD OF WIRING BOARD

CROSS-REFERENCE TO RELATED APPLICATION

This application is based upon and claims the benefit of priority of the prior Japanese Patent Application No. 2021-154067, filed on Sep. 22, 2021, the entire contents of which are incorporated herein by reference.

FIELD

The embodiment discussed herein is related to a wiring board and a manufacturing method of the wiring board.

BACKGROUND

In related art, for example, some wiring boards on which a semiconductor chip is mounted have a multilayer wiring structure formed by utilization of a semi-additive method, for example. Specifically, a wiring layer is formed on an insulating layer by electroless plating and electrolytic plating, and an insulating layer covering the wiring layer is further formed. In such a manner, a wiring board having the multilayer wiring structure is formed by repetition of lamination of an insulating layer and a wiring layer.

In such a wiring board, a via wiring line penetrating through an insulating layer is provided as necessary, and wiring patterns of different wiring layers are electrically connected. In addition, a wiring layer in the outermost layer of the multilayer wiring structure is covered with an insulating solder resist layer. Then, since a connection terminal penetrating through the solder resist layer is provided as necessary, the wiring layer in the outermost layer and an electronic component such as a semiconductor chip mounted on the solder resist layer can be electrically connected.

An opening portion penetrating into the wiring layer is formed in the insulating layer or the solder resist layer, a seed layer is formed by electroless plating on a surface of the insulating layer or the solder resist layer including an inner wall surface of the opening portion, and electrolytic plating is performed on the seed layer, whereby the via wiring line and the connection terminal are formed. In addition, after the step of forming the opening portion in the insulating layer or the solder resist layer, a resin residue adhering to an upper surface of the wiring layer exposed from a bottom of the opening portion is generally removed by desmear treatment using a chemical solution. At this time, the whole resin residue may not be removed, and a part of the resin residue may remain on the upper surface of the wiring layer exposed from the bottom of the opening portion.

With respect to the above, a technique of removing a remaining resin residue and forming a recessed portion in an upper surface of a wiring layer exposed from a bottom of an opening portion by performing etching on the upper surface of the wiring layer after desmear treatment is performed and before a seed layer is formed has been proposed. In a case where this technique is employed, the seed layer that is a base of a via wiring line and a connection terminal is formed by electroless plating on a surface of an insulating layer or a solder resist layer including an inner wall surface of the opening portion, and a bottom surface of the recessed portion of the wiring layer. Then, the via wiring line and the connection terminal are formed as an electrolytic plating film by electrolytic plating on the seed layer.

Japanese Patent Application Laid-open No. 2000-244127

However, in a wiring board adopting the above-described technique in the related art, there is a problem that connection reliability of a via wiring line and a connection terminal is not sufficient.

Specifically, when an electrolytic plating film of the via wiring line and the connection terminal is formed on a seed layer, a plating film is deposited from the seed layer on an inner wall surface of an opening portion, and at the same time, a plating solution enters a recess portion of a wiring layer and a plating film is deposited from the seed layer on a bottom surface of the recess portion toward a bottom of the opening portion. The plating film deposited from the seed layer on the inner wall surface of the opening portion closes the opening portion before the plating film deposited from the seed layer on the bottom surface of the recess portion grows to the bottom of the opening portion. This is because entrance of the plating solution from the opening portion to the bottom surface of the recess portion is difficult and the growth of the plating film deposited from the seed layer on the bottom surface of the recess portion is delayed since the bottom surface of the recess portion has a concave shape recessed downward and a distance from the deepest portion of the bottom surface of the recess portion to the bottom of the opening portion is relatively long. When the opening portion is closed by the plating film deposited from the seed layer on the inner wall surface of the opening portion, the plating solution does not reach the bottom surface of the recess portion, and the growth of the plating film deposited from the seed layer on the bottom surface of the recess portion is stopped. As a result, in the vicinity of the bottom of the opening portion, embeddability by the electrolytic plating film is deteriorated, and a void is generated in the via wiring line and the connection terminal that are the electrolytic plating film.

When the void is generated, density of the via wiring line and the connection terminal decreases, and electrical connection between the via wiring line and the connection terminal and the wiring layer becomes unstable. That is, connection reliability with the wiring layer of the wiring board is deteriorated.

SUMMARY

According to an aspect of an embodiment, a wiring board includes a wiring layer; an insulating layer laminated on the wiring layer; an opening portion penetrating through the insulating layer to the wiring layer; a recess portion formed on a surface of the wiring layer exposed from the opening portion of the insulating layer; and a conductor film formed in the opening portion of the insulating layer and the recess portion of the wiring layer, wherein the recess portion of the wiring layer has a raised portion, which is raised higher than an outer peripheral portion of a bottom surface of the raised portion, at a central portion of the bottom surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Hereinafter, an embodiment of a wiring board and a manufacturing method of the wiring board disclosed in the present application will be described in detail with reference to the drawings. Note that the disclosed technology is not limited by this embodiment.

EMBODIMENT

Figure 1:
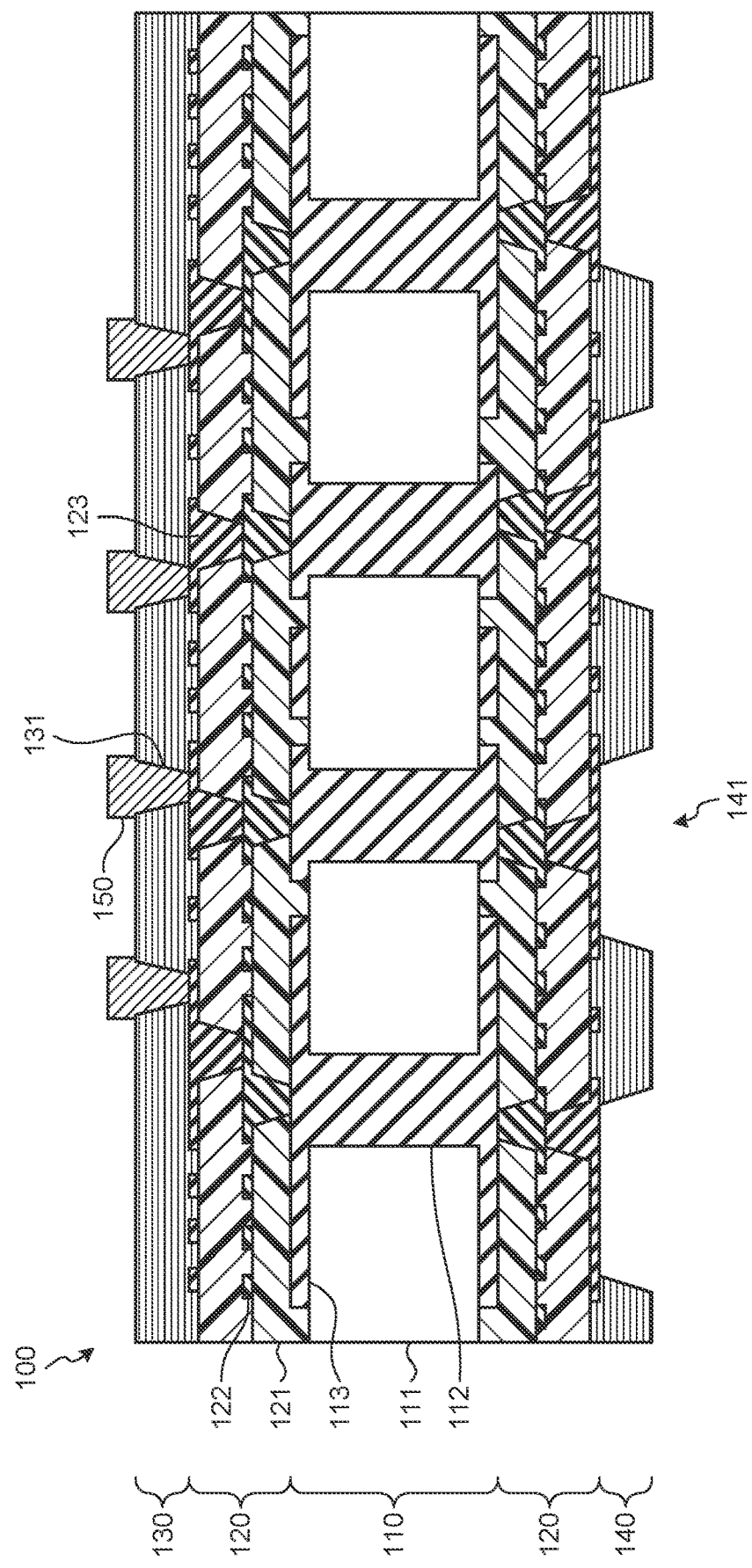
FIG. 1 is a view illustrating a configuration of a wiring board according to an embodiment.

FIG. 1 is a view illustrating a configuration of a wiring board 100 according to the embodiment. A cross section of the wiring board 100 is schematically illustrated in FIG. 1. The wiring board 100 illustrated in FIG. 1 can be used as, for example, a board of a semiconductor device on which a semiconductor chip is mounted.

The wiring board 100 has a laminated structure, and includes a core board 110, multilayer wiring structures 120, and solder resist layers 130 and 140. In the following, as illustrated in FIG. 1, the description will be made on the assumption that the solder resist layer 140 is the lowermost layer and the solder resist layer 130 is the uppermost layer. However, the wiring board 100 may be used in an arbitrary posture and may be used upside down, for example.

In the core board 110, wiring layers 113 are formed on both surfaces of a base material 111, which is a plate-shaped insulator, by metal plating. The wiring layers 113 on the both surfaces are connected by a through wiring line 112 penetrating through the base material 111 as necessary.

Each of the multilayer wiring structures 120 is formed by lamination of layers including an insulating layer 121 and a conductive wiring layer 122. The insulating layer 121 is formed of a non-photosensitive and thermosetting insulating resin having heat resistance, such as an epoxy resin, a polyimide resin, and a cyanate resin. In addition, the wiring layer 122 is formed of metal such as copper or a copper alloy, for example. In FIG. 1, two layers are laminated in the multilayer wiring structure 120 on an upper side of the core board 110, and two layers are laminated in the multilayer wiring structure 120 on a lower side of the core board 110. However, the number of laminated layers may be one, or three or more. The wiring layers 113 and 122 adjacent to each other with the insulating layer 121 interposed therebetween are connected by a via wiring line 123 penetrating through the insulating layer 121 as necessary. At a position where the via wiring line 123 is formed, an opening portion (hereinafter, appropriately referred to as "via hole") is formed in the insulating layer 121, and the wiring layer 113 or wiring layer 122 that is the layer on the lower side is exposed from this via hole. Since the insulating layer 121 is formed of a non-photosensitive thermosetting resin, a via hole in which the via wiring line 123 is formed can be formed by laser processing. Then, as described later, a recess portion is formed in the surface of the wiring layer 113 or the wiring layer 122 exposed from the via hole of the insulating layer 121, and a central portion of a bottom surface of the recess portion is raised higher than an outer peripheral portion of the bottom surface.

The solder resist layer 130 is a layer that covers the uppermost wiring layer 122 of the multilayer wiring structure 120 and protects the wiring line. The solder resist layer 130 is a layer formed of a non-photosensitive and thermosetting insulating resin having heat resistance, such as an epoxy resin, a polyimide resin, and a cyanate resin, and is one of the insulating layers.

The wiring board 100 on a side of the solder resist layer 130 is a surface on which an electronic component such as a semiconductor chip is mounted. At a position where the semiconductor chip is mounted, an opening portion 131 is formed in the solder resist layer 130, and the wiring layer 122 of the multilayer wiring structure 120 is exposed from the opening portion 131. Since the solder resist layer 130 is formed of a non-photosensitive thermosetting resin, the opening portion 131 can be formed by laser processing. Then, a connection terminal 150 that connects the wiring layer 122 of the multilayer wiring structure 120 and an electrode of the semiconductor chip is formed in the opening portion 131. As described later, a recess portion is formed in the surface of the wiring layer 122 exposed from the opening portion 131, and a central portion of a bottom surface of the recess portion is raised higher than an outer peripheral portion of the bottom surface.

Similarly to the solder resist layer 130, the solder resist layer 140 is a layer that covers the wiring layer 122 on the surface of the multilayer wiring structure 120 and that protects the wiring line. The solder resist layer 140 is a layer formed of a non-photosensitive and thermosetting insulating resin having heat resistance, such as an epoxy resin, a polyimide resin, and a cyanate resin, and is one of the insulating layers.

The wiring board 100 on a side of the solder resist layer 140 is a surface connected to an external component, device, or the like. At a position where an external connection terminal electrically connected to the external component or device is formed, an opening portion 141 is formed in the solder resist layer 140, and the wiring layer 122 of the multilayer wiring structure 120 is exposed from the opening portion 141. For example, an external connection terminal such as a solder ball is formed in the opening portion 141. Since the solder resist layer 140 is formed of a non-photosensitive thermosetting resin, the opening portion 141 can be formed by laser processing.

Figure 2:
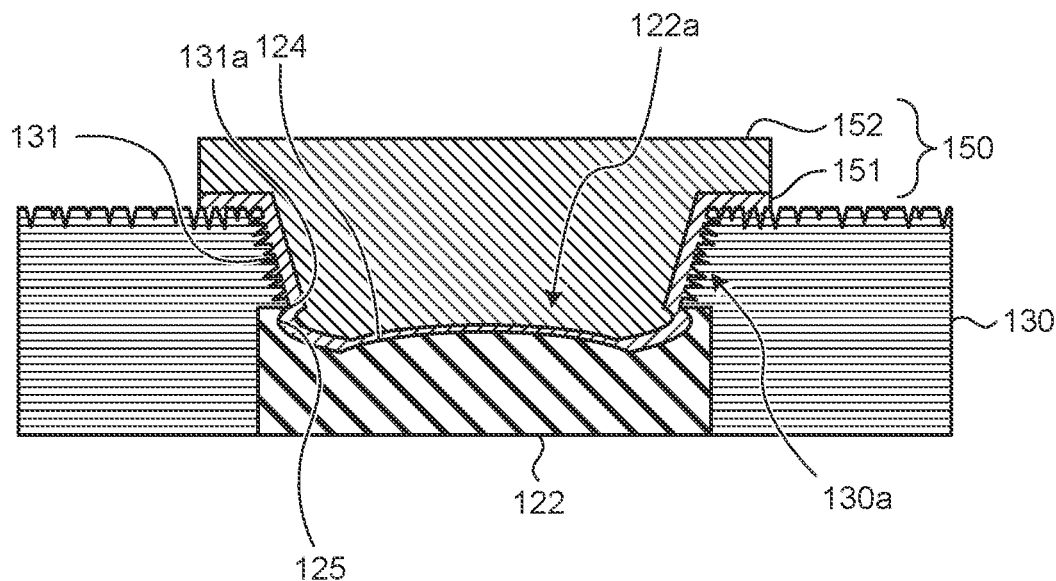
FIG. 2 is an enlarged view around a connection terminal.

FIG. 2 is an enlarged view around the connection terminal 150. In FIG. 2, the vicinity of a connection portion between the connection terminal 150 and the wiring layer 122 of the multilayer wiring structure 120 is illustrated in an enlarged manner.

As illustrated in FIG. 2, the connection terminal 150 includes a seed layer 151 that is an electroless plating film formed by electroless plating, and a post 152 that is an electrolytic plating film formed on the seed layer 151 by electrolytic plating. In addition, the wiring layer 122 is exposed at the bottom of the opening portion 131 where the connection terminal 150 is formed, and a recess portion 122a is formed in the surface of the wiring layer 122. At a central portion of the bottom surface of the recess portion 122a, a raised portion 124 that is raised higher than an outer peripheral portion of the bottom surface toward the bottom of the opening portion 131 is formed. The raised portion 124 is raised in a curved shape, and a rounded top is located below the bottom of the opening portion 131. In other words, the top of the raised portion is located below the surface of the wiring layer 122. Since a distance between the bottom surface of the recess portion 122a and the bottom of the opening portion 131 is shortened in the raised portion 124 as compared with a case where the bottom surface of the recess portion 122a has a concave shape, embeddability by the post 152 is improved in the vicinity of the bottom of the opening portion 131, and generation of a void in the post 152 is controlled.

That is, the seed layer 151 covers the inner wall surface of the opening portion 131 and the bottom surface of the recess portion 122a. When the post 152 is formed on the seed layer 151 by electrolytic plating, a plating film is deposited from the seed layer 151 on the bottom surface of the recess portion 122a toward the bottom of the opening portion 131. At this time, since the distance from the raised portion 124 to the bottom of the opening portion 131 is short, a growth rate of the plating film deposited from the seed layer 151 on the bottom surface of the recess portion 122a increases, whereby the vicinity of the bottom of the opening portion 131 is appropriately filled with electrolytic plating, and a lower portion of the post 152 is formed. As a result, generation of a void at a root of the connection terminal 150 is controlled, and connection reliability between the connection terminal 150 and the wiring layer 122 can be improved.

In addition, a concave portion 125 recessed outward from a periphery 131a on the bottom side of the opening portion 131 is formed in an inner wall of the recess portion 122a. Since the raised portion 124 is formed at a central portion of the bottom surface of the recess portion 122a and the concave portion 125 is formed in the inner wall of the recess portion 122a, circulation of the plating solution used to form the post 152 is promoted in the vicinity of the bottom of the opening portion 131. This further increases the growth rate of the plating film deposited from the seed layer 151 on the bottom surface of the recess portion 122a. As a result, generation of a void at the root of the connection terminal 150 is further controlled, and the connection reliability between the connection terminal 150 and the wiring layer 122 can be further improved.

In addition, in the vicinity of the position where the connection terminal 150 is formed, the surface of the solder resist layer 130 including the inner wall surface of the opening portion 131 is roughened and a roughened surface 130a is formed. The seed layer 151 that forms the connection terminal 150 is formed on the roughened surface 130a by electroless plating. Since the roughened surface 130a has a larger contact area with the seed layer 151 than a smooth surface, the contact area with the post 152 via the seed layer 151 increases. As a result, adhesion between the connection terminal 150 and the solder resist layer 130 can be improved.

Figure 3:
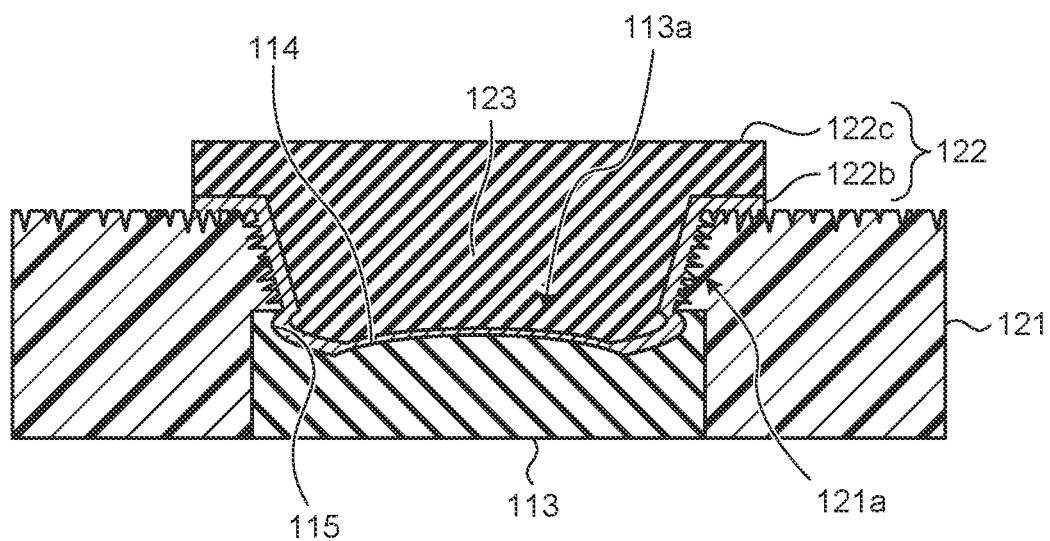
FIG. 3 is an enlarged view around a via wiring line.

Note that although the structure of the connection terminal 150 has been described here, the via wiring line 123 penetrating through the insulating layer 121, and the wiring layer 122 in the periphery are also formed of a seed layer and an electrolytic plating layer, similarly to the connection terminal 150. Specifically, for example, as illustrated in FIG. 3, the wiring layer 122 includes a seed layer 122b and an electrolytic plating layer 122c at a position where the via wiring line 123 is formed. FIG. 3 is an enlarged view around the via wiring line 123. Electrolytic plating is applied on the seed layer 122b in the opening portion (that is, via hole) of the insulating layer 121, whereby the via wiring line 123 is formed. Such a wiring layer 122 and the via wiring line 123 are formed by, for example, a semi-additive method.

Then, the wiring layer 113 is exposed at the bottom of the via hole of the insulating layer 121, in which via hole the via wiring line 123 is formed, and a recess portion 113a is formed in a surface of the wiring layer 113. At a central portion of a bottom surface of the recess portion 113a, a raised portion 114 raised higher than an outer peripheral portion of the bottom surface toward the bottom of the via hole is formed, and the seed layer 122b is formed in such a manner as to cover an inner wall surface of the via hole and the bottom surface of the recess portion 113a. Since the via wiring line 123 is formed by application of electrolytic plating to the seed layer 122b, it is possible to control generation of a void at the root of the via wiring line 123 and to improve connection reliability between the via wiring line 123 and the wiring layer 113 (or lower wiring layer 122).

In addition, in an inner wall of the recess portion 113a, a concave portion 115 recessed outward from a periphery of the insulating layer 121 on the bottom side of the via hole is formed. Since the raised portion 114 is formed at the central portion of the bottom surface of the recess portion 113a and the concave portion 115 is formed in the inner wall of the recess portion 113a, circulation of the plating solution used to form the via wiring line 123 is promoted in the vicinity of the bottom of the via hole of the insulating layer 121. This further increases the growth rate of the plating film deposited from the seed layer 122b on the bottom surface of the recess portion 113a. As a result, generation of a void at the root of the via wiring line 123 is further controlled, and the connection reliability between the via wiring line 123 and the wiring layer 113 (or lower wiring layer 122) can be further improved.

In addition, in the vicinity of the position where the via wiring line 123 is formed, a surface of the insulating layer 121 including the inner wall surface of the via hole is roughened and a roughened surface 121a is formed. The seed layer 122b forming the via wiring line 123 is formed on the roughened surface 121a by electroless plating. Since the via wiring line 123 is formed by application of electrolytic plating to the seed layer 122b, a contact area between the insulating layer 121 and the via wiring line 123 via the seed layer 122b can be increased to improve adhesion between the via wiring line 123 and the insulating layer 121.

Figure 4:
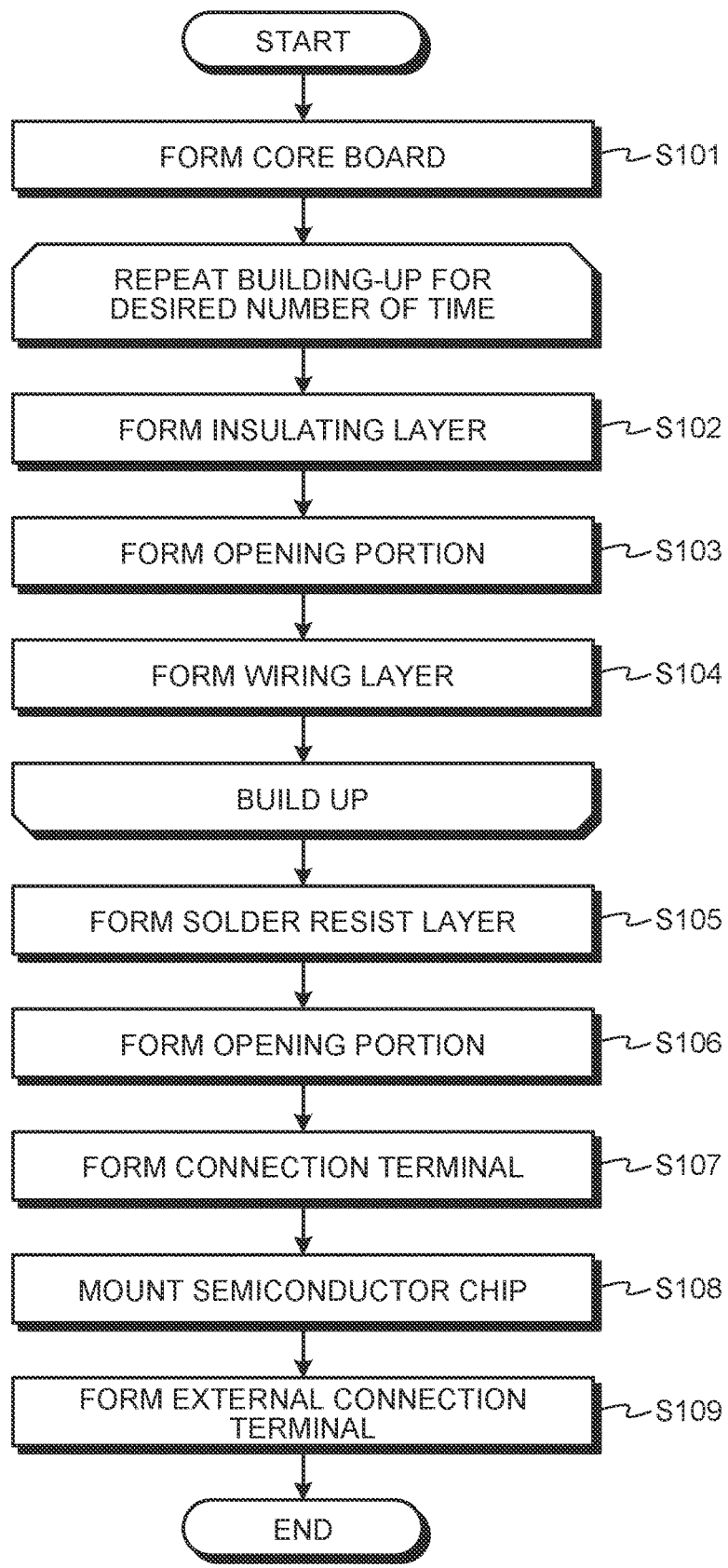
FIG. 4 is a flowchart illustrating an example of a manufacturing method of a semiconductor device according to the embodiment.

Next, a manufacturing method of a semiconductor device having the wiring board 100 configured in the above manner will be described with specific examples with reference to FIG. 4. FIG. 4 is a flowchart illustrating an example of a manufacturing method of a semiconductor device according to the embodiment.

First, the core board 110 to be a support member of the wiring board 100 is formed (Step S101).

Figure 5:
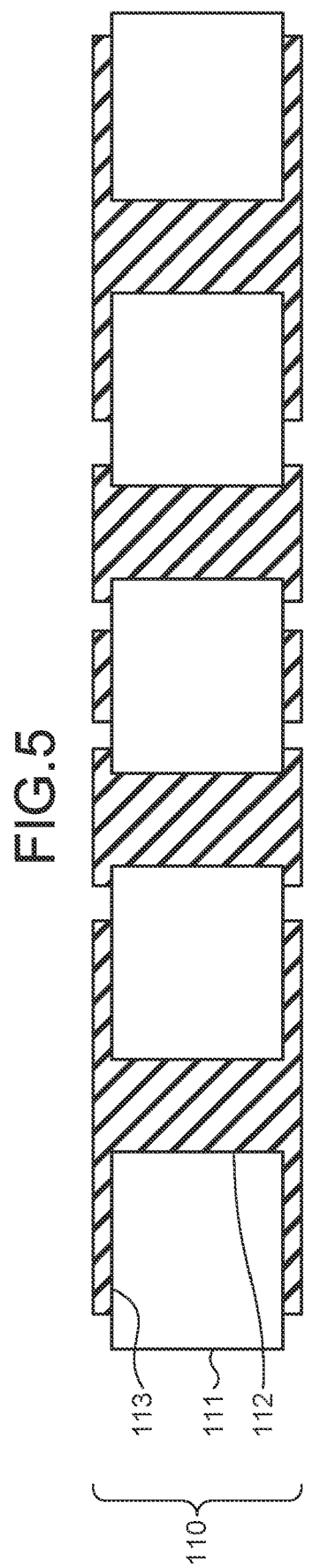
FIG. 5 is a view illustrating a specific example of a core board forming step.

Specifically, for example, as illustrated in FIG. 5, the through wiring line 112 penetrating through the base material 111 is formed in the base material 111 that is a plate-shaped insulator, and the wiring layers 113 made of metal such as copper or a copper alloy are formed on both surfaces of the base material 111 by, for example, copper foil or copper plating. FIG. 5 is a view illustrating a specific example of a core board forming step. The wiring layers 113 on the both surfaces of the base material 111 are connected by the through wiring line 112 formed by plating of metal such as copper or a copper alloy as necessary. As the base material 111, for example, a reinforcing material such as a glass woven fabric impregnated with an insulating resin such as an epoxy resin can be used. As the reinforcing material, a glass nonwoven fabric, an aramid woven fabric, an aramid nonwoven fabric, or the like can be used in addition to the glass woven fabric. In addition, as the insulating resin, a polyimide resin, a cyanate resin, or the like can be used in addition to the epoxy resin.

Figure 6:
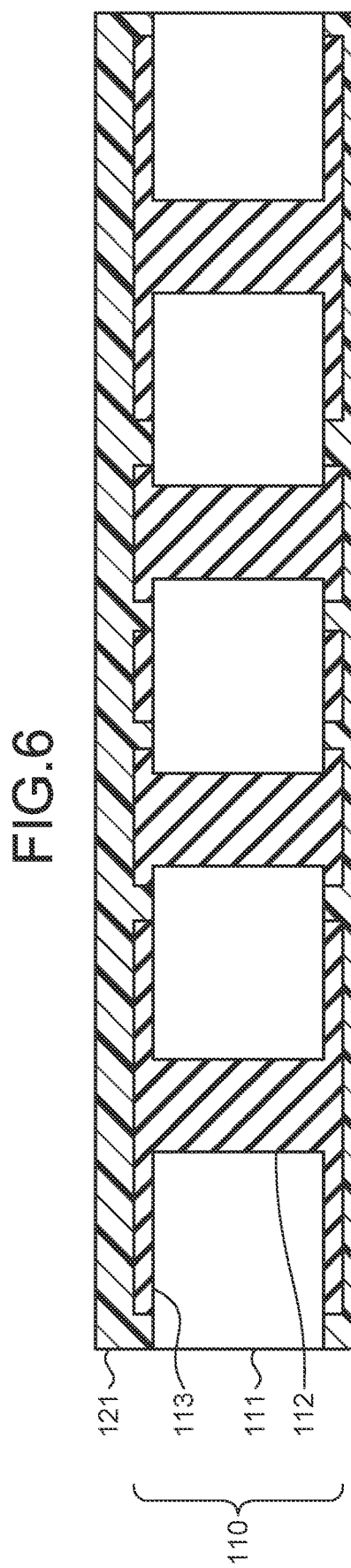
FIG. 6 is a view illustrating a specific example of an insulating layer forming step.

Then, the multilayer wiring structures 120 are formed on the upper surface and the lower surface of the core board 110 by a build-up method. Specifically, for example, as illustrated in FIG. 6, first, the insulating layers 121 are formed on the upper surface and the lower surface of the core board 110 (Step S102). That is, the insulating layers 121 formed of a non-photosensitive and thermosetting resin having heat resistance, such as an epoxy resin, a polyimide resin, and a cyanate resin are laminated on the wiring layers 113 of the core board 110. FIG. 6 is a view illustrating a specific example of an insulating layer forming step.

Figure 7:
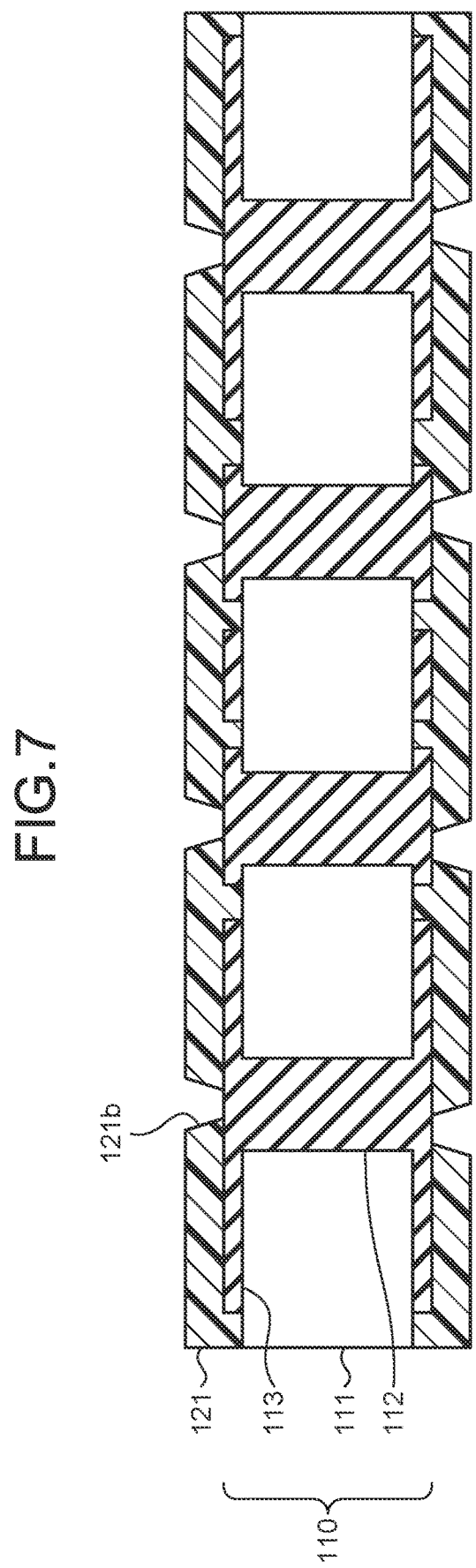
FIG. 7 is a view illustrating a specific example of an opening portion forming step.

An opening portion (that is, through hole) is formed at a position where the via wiring line 123 is formed in each of the insulating layers 121 (Step S103). That is, for example, as illustrated in FIG. 7, opening portions 121b that penetrate through the insulating layers 121 and expose the wiring layers 113 on the bottom surfaces are formed. At this time, since the insulating layers 121 are formed of a non-photosensitive resin, the opening portions 121b are formed by laser processing. For the laser processing, for example, a laser such as a $CO_2$ laser or a UV laser is used. In the laser processing, a surface of each of the insulating layers 121 is irradiated with the laser in such a manner that a surface temperature of the insulating layer 121 becomes at least equal to or higher than a glass transition temperature of the resin included in the insulating layer 121. Furthermore, in the laser processing, the laser has an intensity distribution in which intensity at a central portion is lower than intensity at an outer peripheral portion in a direction along a beam diameter of the laser. When the opening portions 121b are formed in the insulating layers 121, the surfaces of the insulating layers 121 are irradiated with the laser having such an intensity distribution. As a result, the opening portions 121b are formed in the insulating layers 121, and a residue of the resin included in the insulating layers 121 remains in a central portion of a surface of the wiring layer 113 exposed from each of the opening portions 121b. FIG. 7 is a view illustrating a specific example of an opening portion forming step.

When each of the opening portions 121b is formed in the insulating layers 121, the recess portion 113a (see FIG. 3) is formed by etching in the surface of the wiring layer 113 exposed from the opening portion 121b. That is, for example, by wet etching using an amine-based or ammonia-based alkaline etching solution, an outer peripheral portion of the surface of the wiring layer 113 is selectively etched with the resin residue remaining in the central portion of the surface of the exposed wiring layer 113 being a mask. As a result, the outer peripheral portion of the surface of the wiring layer 113 is recessed lower than the central portion of the surface of the wiring layer 113 and a groove is formed. Furthermore, for example, by adjustment of time of immersion in the etching solution, the wiring layer 113 located below the resin residue is etched from the groove, whereby the resin residue is removed and the recess portion 113a is formed in the wiring layer 113. At this time, a central portion of a bottom surface of the recess portion 113a is raised higher than an outer peripheral portion of the bottom surface toward a bottom of the opening portion 121b, and forms the raised portion 114 (see FIG. 3). Furthermore, when the raised portion 114 is formed, an inner wall of the recess portion 113a is recessed outward from a periphery on the bottom side of the opening portion 121b, and forms the concave portion 115 (see FIG. 3).

When the recess portion 113a is formed, a surface of the insulating layer 121 including an inner wall surface of the opening portion 121b is roughened. That is, the surface of the insulating layer 121 is roughened by, for example, dry etching using plasma or wet etching using a chemical solution.

Then, the wiring layer 122 is formed on the insulating layer 121 in which the opening portion 121b is formed (Step S104). The wiring layer 122 is formed by, for example, a semi-additive method. In this case, a seed layer is formed on the surface of the insulating layer 121 including the inner wall surface of the opening portion 121b by, for example, electroless copper plating. Then, a plating resist layer having an opening in a wiring pattern formed portion is formed on the seed layer. Subsequently, for example, electrolytic copper plating is performed on the seed layer exposed from the opening of the plating resist layer, and an electrolytic plating layer is formed. Then, the plating resist layer is removed. Subsequently, the seed layer exposed from the electrolytic plating layer is removed by etching, whereby the wiring layer 122 having a desired wiring pattern is formed.

Figure 8:
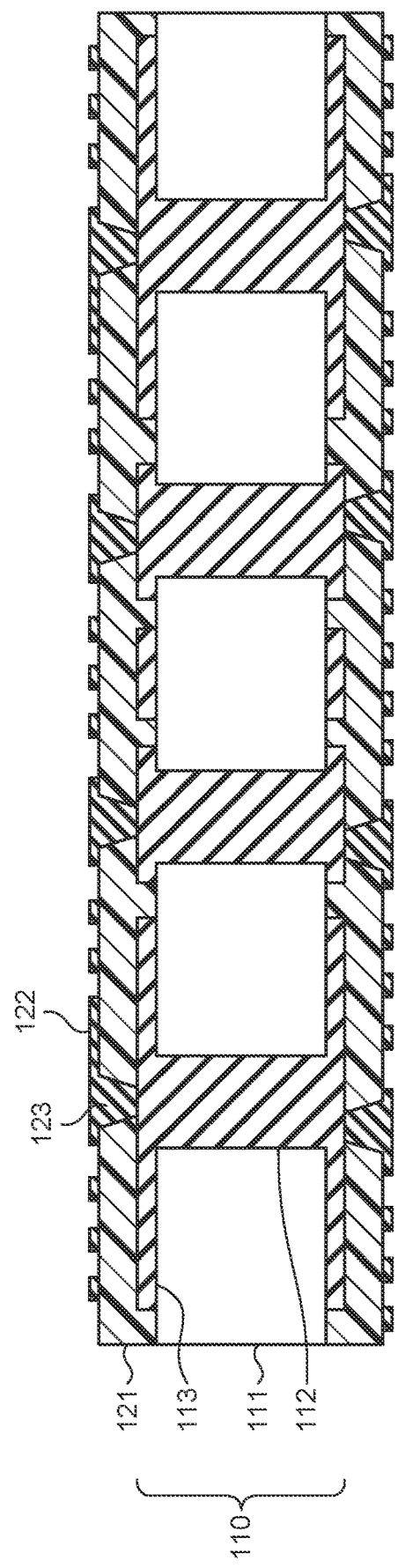
FIG. 8 is a view illustrating a specific example of a wiring layer forming step.

At this time, for example, as illustrated in FIG. 8, the opening portion 121b of the insulating layer 121 is filled with electrolytic copper plating, whereby the via wiring line 123 penetrating through the insulating layer 121 is formed, and the wiring layer 113 and the wiring layer 122 of the core board 110 are electrically connected. FIG. 8 is a view illustrating a specific example of a wiring layer forming step. Furthermore, the seed layer forming the via wiring line 123 is formed in such a manner as to cover an inner peripheral surface of the opening portion 121b and the bottom surface of the recess portion 113a having the raised portion 114, and the via wiring line 123 is formed by application of electrolytic plating to the seed layer in the opening portion 121b. Thus, generation of a void at the root of the via wiring line 123 is controlled, and connection reliability by the via wiring line 123 can be improved. Note that the seed layer may be formed by sputtering of metal such as copper. A seed layer formed by electroless plating or sputtering or an electrolytic plating layer is an example of a conductor film.

Figure 9:
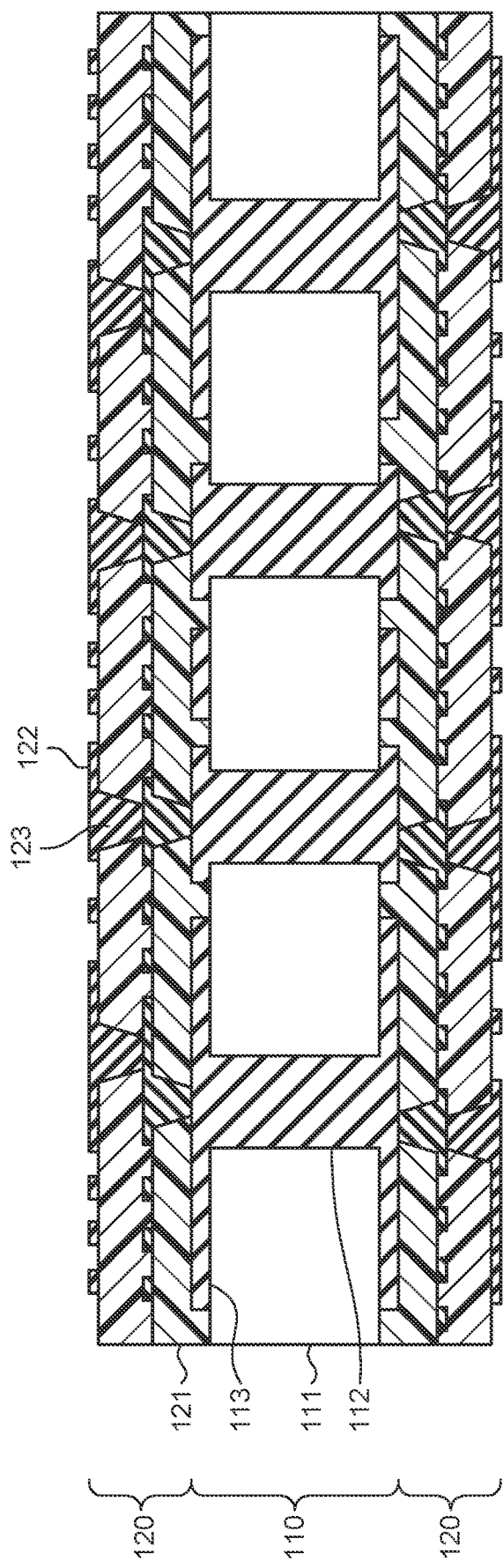
FIG. 9 is a view illustrating a specific example of a multilayer wiring structure.

By repetition of formation of the insulating layer 121, formation of the opening portion 121b, and formation of the wiring layer 122 in the above-described manner for a desired number of times, the insulating layer 121 and the wiring layer 122 are sequentially laminated and the multilayer wiring structures 120 are formed. In the following, for example, as illustrated in FIG. 9, the description will be continued on the assumption that two layers that are the insulating layer 121 and the wiring layer 122 are formed on each of the upper and lower surfaces of the core board 110. FIG. 9 is a view illustrating a specific example of the multilayer wiring structures. At the bottom of each of the opening portions 121b of the insulating layers 121 in which portions the via wiring lines 123 are respectively formed and which portions are illustrated in FIG. 9, a wiring layer (wiring layer 113 or lower wiring layer 122) is exposed, and a recess portion having a raised portion at a central portion of a bottom surface is formed on a surface of this wiring layer. Thus, generation of a void at the root of each of the via wiring lines 123 is controlled, and connection reliability by each of the via wiring lines 123 is improved.

When the multilayer wiring structures 120 are formed by the build-up method, the wiring layers 122 on the surfaces of the multilayer wiring structures 120 are respectively covered with the solder resist layers 130 and 140 (Step S105). That is, the wiring layer 122 on the surface of the multilayer wiring structure 120 laminated on the upper surface of the core board 110 is covered with the solder resist layer 130, and the wiring layer 122 on the surface of the multilayer wiring structure 120 laminated on the lower surface of the core board 110 is covered with the solder resist layer 140. The solder resist layers 130 and 140 are formed of a non-photosensitive and thermosetting insulating resin having heat resistance, such as an epoxy resin, a polyimide resin, and a cyanate resin.

Figure 10:
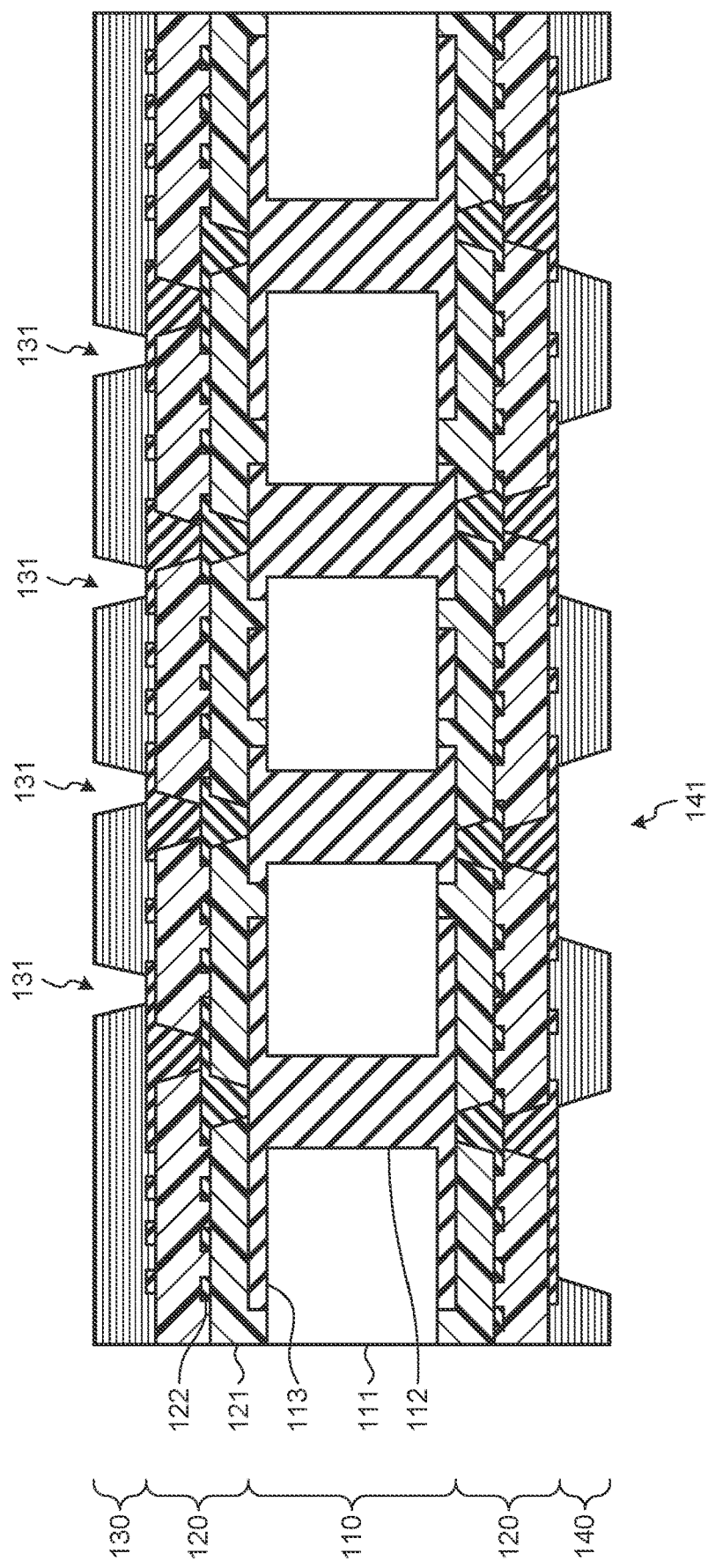
FIG. 10 is a view illustrating a specific example of a solder resist layer forming step.

Then, for example, as illustrated in FIG. 10, in the solder resist layer 130 on a side on which a semiconductor chip is mounted, the opening portions 131 are formed at positions where the connection terminals 150 with respect to the semiconductor chip are provided (Step S106). FIG. 10 is a view illustrating a specific example of a solder resist layer forming step. The uppermost wiring layer 122 of the multilayer wiring structure 120 is exposed to the bottom surfaces of the opening portions 131. On the other hand, in the solder resist layer 140 on a side connected to an external component or device, opening portions 141 are formed at positions where external connection terminals are provided. The lowermost wiring layer 122 of the multilayer wiring structure 120 is exposed to the bottom surfaces of the opening portions 141.

Since the solder resist layers 130 and 140 are formed of a non-photosensitive resin, the opening portions 131 and 141 are formed by laser processing. For the laser processing, for example, a laser such as a $CO_2$ laser or a UV laser is used. In the laser processing, surfaces of the solder resist layers 130 and 140 are irradiated with the laser in such a manner that a surface temperature of the solder resist layers 130 and 140 is at least equal to or higher than a glass transition temperature of the resin included in the solder resist layers 130 and 140. Furthermore, in the laser processing, the laser has an intensity distribution in which intensity at a central portion is lower than intensity at an outer peripheral portion in a direction along a beam diameter of the laser. When the opening portions 131 and 141 are formed in the solder resist layers 130 and 140, the surfaces of the solder resist layers 130 and 140 are irradiated with the laser having such an intensity distribution. As a result, the opening portions 131 and 141 are formed in the solder resist layers 130 and 140, and a residue of the resin included in the solder resist layers 130 and 140 remains at a central portion of a surface of the wiring layers 122 exposed from the opening portions 131 and 141.

When the opening portions 141 are formed in the solder resist layer 140, desmear treatment is performed to remove the resin residue in the opening portions 141. That is, for example, a potassium permanganate solution is used to remove the resin residue remaining in and around the opening portions 141.

When the opening portions 131 are formed in the solder resist layer 130, the recess portions 122a (see FIG. 2) are formed by etching in the surface of the wiring layer 122 exposed from the opening portions 131. That is, for example, by wet etching using an amine-based or ammonia-based alkaline etching solution, the outer peripheral portion of the surface of the wiring layer 122 is selectively etched with the resin residue remaining at the central portion of the surface of the exposed wiring layer 122 being a mask. As a result, the outer peripheral portion of the surface of the wiring layer 122 is recessed lower than the central portion of the surface of the wiring layer 122 and a groove is formed. Furthermore, for example, by adjustment of time of immersion in the etching solution, the wiring layer 122 located below the resin residue is etched from the groove, whereby the resin residue is removed and the recess portions 122a are formed in the wiring layer 122. At this time, a central portion of a bottom surface of each of the recess portions 122a is raised higher than an outer peripheral portion of the bottom surface toward the bottom of the opening portion 131, and forms the raised portion 124 (see FIG. 2).

When the recess portions 122a are formed, the surface of the solder resist layer 130 including the inner wall surfaces of the opening portions 131 is roughened. That is, the surface of the solder resist layer 130 is roughened by, for example, dry etching using plasma or wet etching using a chemical solution.

Figure 11:
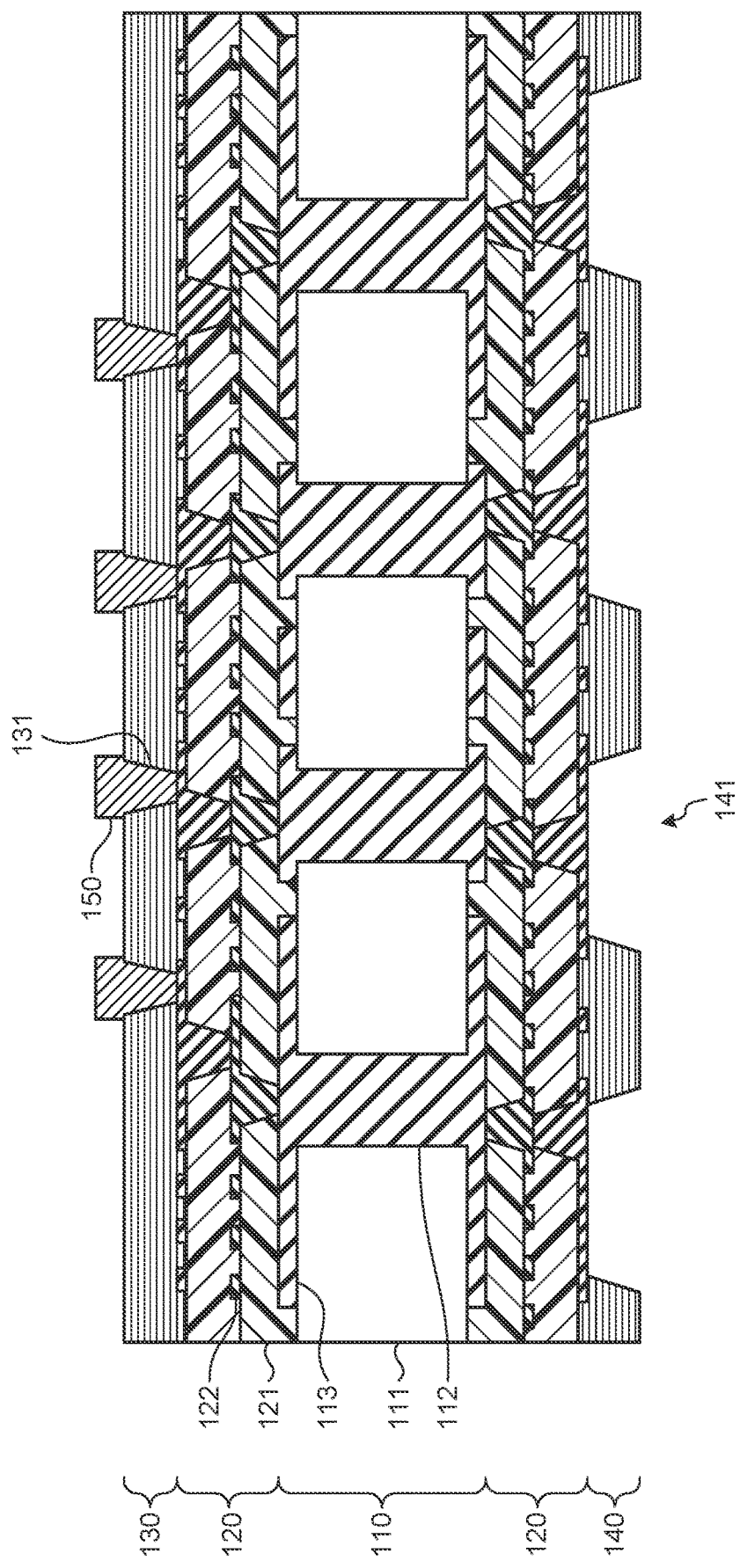
FIG. 11 is a view illustrating a specific example of a connection terminal forming step.

Then, the connection terminal 150 is formed in each of the opening portions 131 of the solder resist layer 130 (Step S107). That is, a seed layer is formed on the surface of the solder resist layer 130 by, for example, electroless copper plating, and, for example, electrolytic copper plating is performed at a position of each of the opening portions 131 on the seed layer, whereby the connection terminal 150 including the seed layer 151 and the post 152 is formed. For example, as illustrated in FIG. 11, the connection terminals 150 are connected to the uppermost wiring layer 122 of the multilayer wiring structure 120 at the positions of the opening portions 131 of the solder resist layer 130. FIG. 11 is a view illustrating a specific example of a connection terminal forming step. Note that the seed layer may be formed by sputtering of metal such as copper. A seed layer formed by electroless plating or sputtering or an electrolytic plating layer is an example of a conductor film.

When the connection terminals 150 are formed, the posts 152 are formed on the seed layer 151 by electrolytic copper plating. At this time, the seed layer 151 is formed in such a manner as to cover the inner peripheral surfaces of the opening portions 131 and the bottom surfaces of the recess portions 122a having the raised portions 124, and the posts 152 are formed by electrolytic copper plating on the seed layer 151 in the opening portions 131. Thus, generation of a void at the root of each of the connection terminals 150 is controlled, and connection reliability by the connection terminal 150 can be improved. Note that formation of the connection terminals 150 will be described later in detail.

Figure 12:
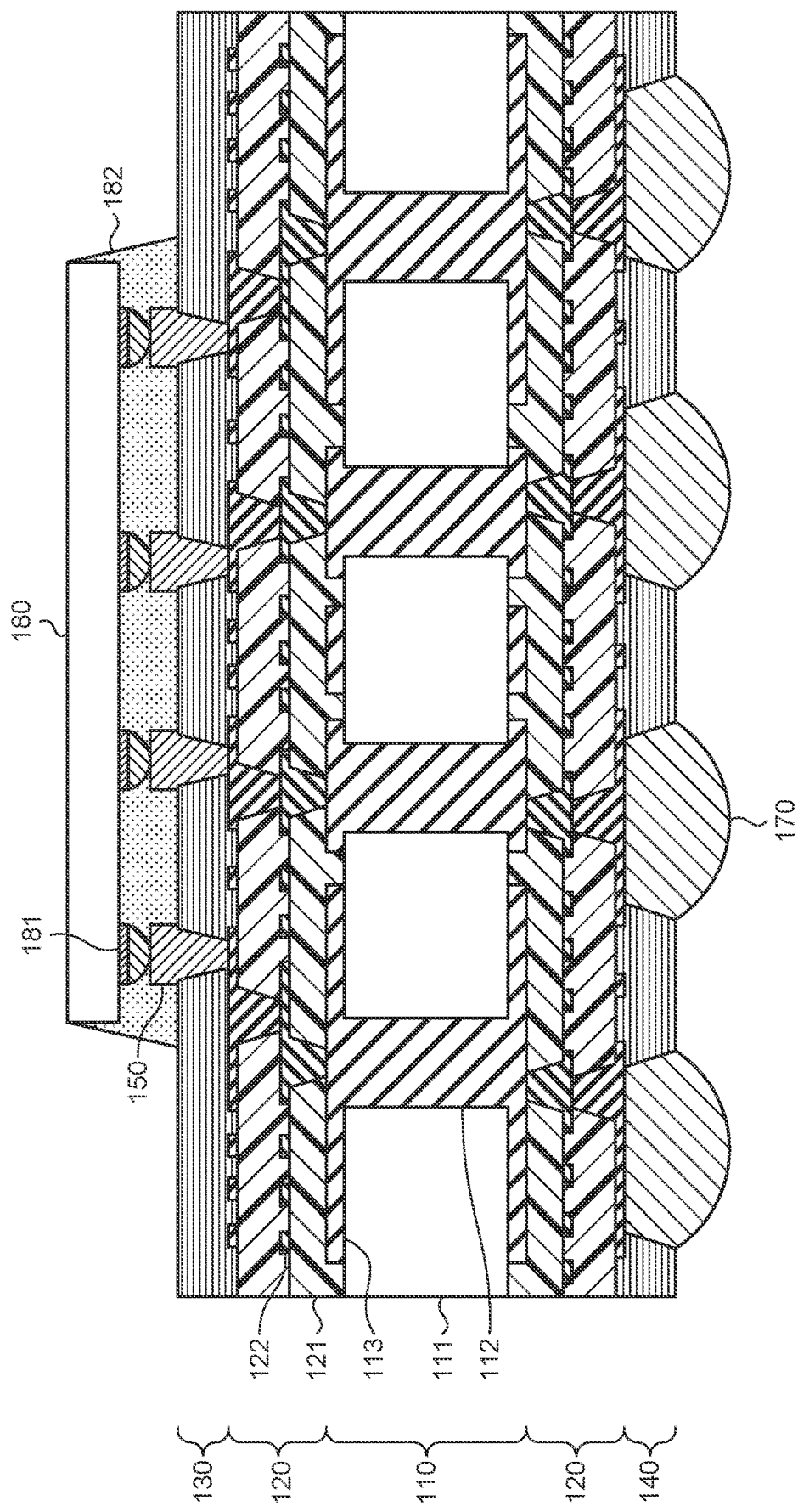
FIG. 12 is a view illustrating a specific example of a semiconductor chip mounting step.

The wiring board 100 is completed when the connection terminals 150 are formed. Then, a semiconductor chip is mounted on the wiring board 100 on a side of the solder resist layer 130 (Step S108), and the connection terminals 150 and electrodes of the semiconductor chip are connected. Specifically, for example, as illustrated in FIG. 12, a semiconductor chip 180 is mounted above the connection terminals 150. FIG. 12 is a view illustrating a specific example of a semiconductor chip mounting step. Electrodes 181 are joined to the connection terminals 150 by, for example, soldering or the like and joint portions between the electrodes 181 and the connection terminals 150 are sealed with an underfill resin 182, whereby the semiconductor chip 180 is mounted on the wiring board 100. Then, external connection terminals such as solder balls 170 are formed in the opening portions 141 of the solder resist layer 140 (Step S109). Note that the order of the step of mounting the semiconductor chip 180 and the step of forming the external connection terminals described above may be reversed. In addition, instead of provision of the solder balls 170, portions of the wiring layer 122 which portions are exposed from the opening portions 141 of the solder resist layer 140 may be used as external connection terminals.

Figure 13:
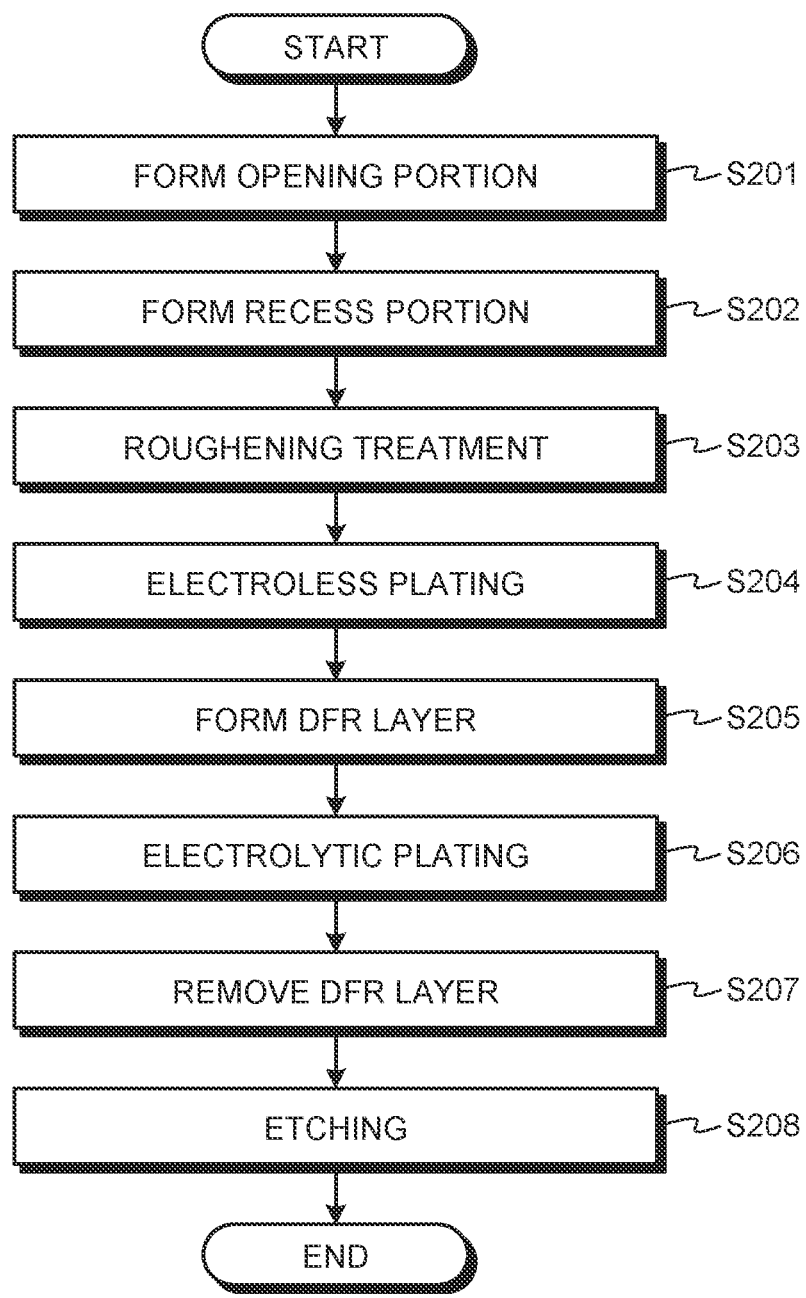
FIG. 13 is a flowchart illustrating an example of the connection terminal forming step.
Figure 14:
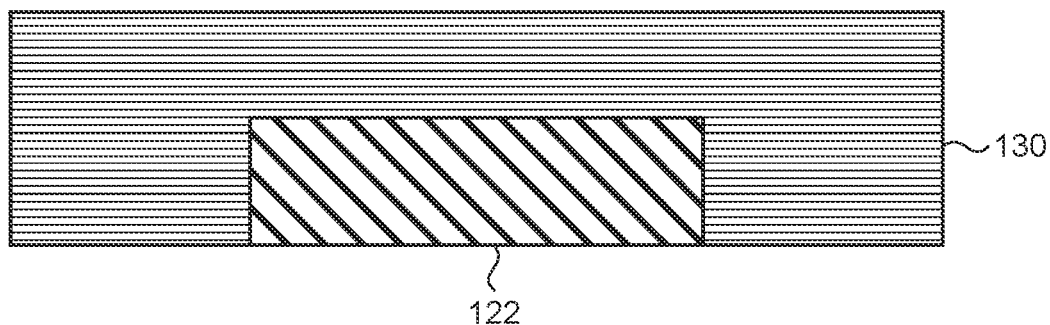
FIG. 14 is an enlarged view of a part of the solder resist layer.

Next, a step of forming the connection terminals 150 will be described more specifically with reference to FIG. 13. FIG. 13 is a flowchart illustrating an example of the connection terminal forming step. Here, for example, as illustrated in FIG. 14, a method of forming a connection terminal 150 on the solder resist layer 130 covering the uppermost wiring layer 122 of the multilayer wiring structure 120 will be described. FIG. 14 is an enlarged view of a part of the solder resist layer 130. However, a method similar to the method of forming the connection terminal 150 in the solder resist layer 130 can also be applied to a case of forming a via wiring line 123 in the insulating layer 121.

Figure 15:
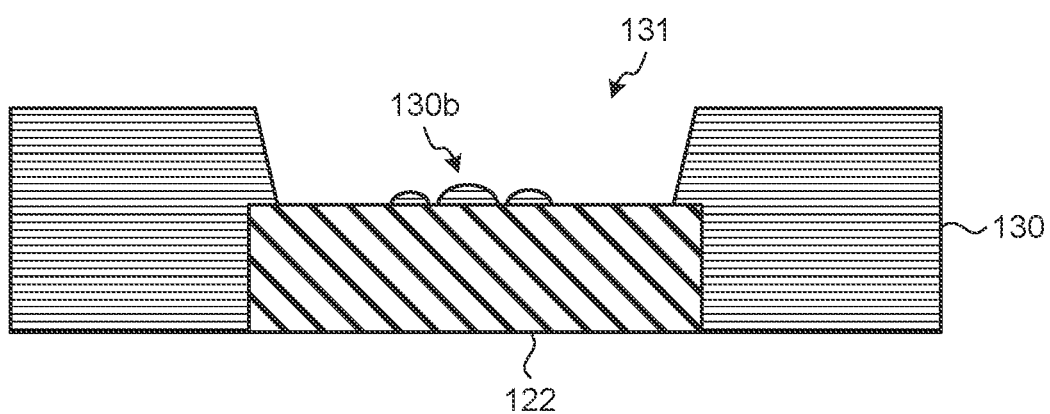
FIG. 15 is a view illustrating a specific example of the opening portion forming step.

When the solder resist layer 130 is formed of a non-photosensitive insulating resin, an opening portion 131 is formed in the solder resist layer 130 (Step S201). Specifically, for example, as illustrated in FIG. 15, the opening portion 131 is formed in the solder resist layer 130 by laser irradiation by a $CO_2$ laser, a UV laser, or the like at a position where a wiring pattern of the wiring layer 122 is arranged. FIG. 15 is a view illustrating a specific example of an opening portion forming step.

Figure 16:
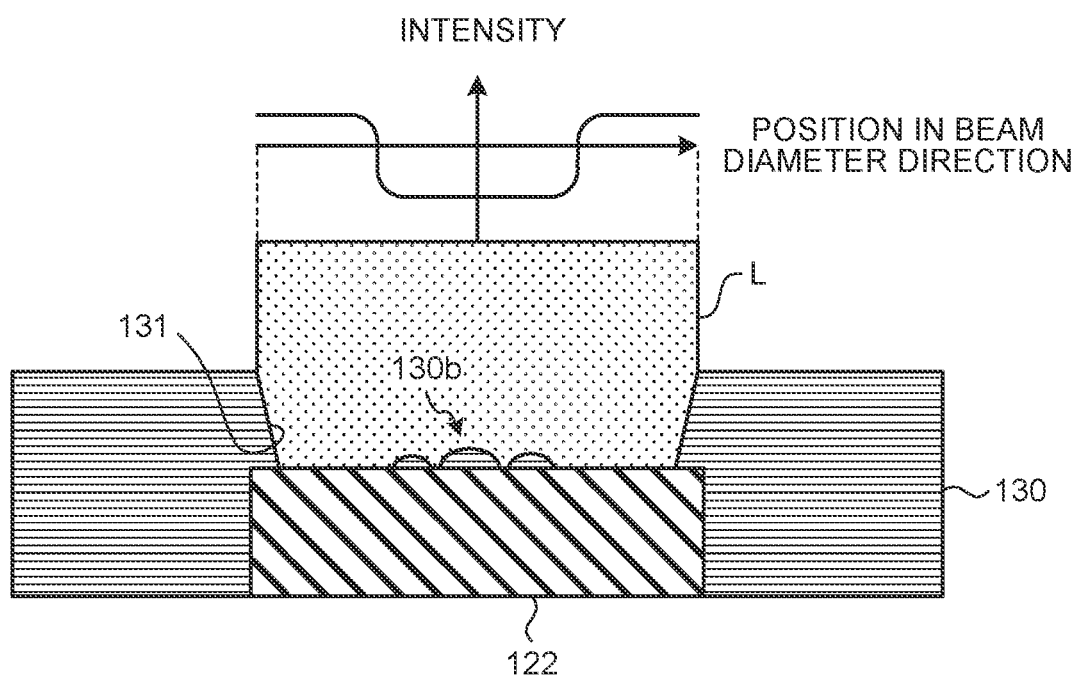
FIG. 16 is a view illustrating a laser intensity distribution.

A laser L used to form the opening portion 131 has, for example, an intensity distribution illustrated in FIG. 16. FIG. 16 is a view illustrating an intensity distribution of the laser L. As illustrated in FIG. 16, the laser L has an intensity distribution in which intensity at a central portion is lower than intensity at an outer peripheral portion in a direction along a beam diameter of the laser. When the opening portion 131 is formed in the solder resist layer 130, the surface of the solder resist layer 130 is irradiated with the laser L having the intensity distribution illustrated in FIG. 16. Thus, as illustrated in FIG. 15 and FIG. 16, a resin residue 130b of the solder resist layer 130 remains at a central portion of the surface of the wiring layer 122 exposed from the opening portion 131 of the solder resist layer 130.

Then, a recess portion 122a is formed by etching in the surface of the wiring layer 122 exposed from the opening portion 131 (Step S202). Specifically, for example, by wet etching using an amine-based or ammonia-based alkaline etching solution, an outer peripheral portion of the surface of the wiring layer 122 is selectively etched with the resin residue 130b remaining at the central portion of the surface of the exposed wiring layer 122 being a mask. As a result, the outer peripheral portion of the surface of the wiring layer 122 is recessed lower than the central portion of the surface of the wiring layer 122 and a groove is formed.

Figure 17:
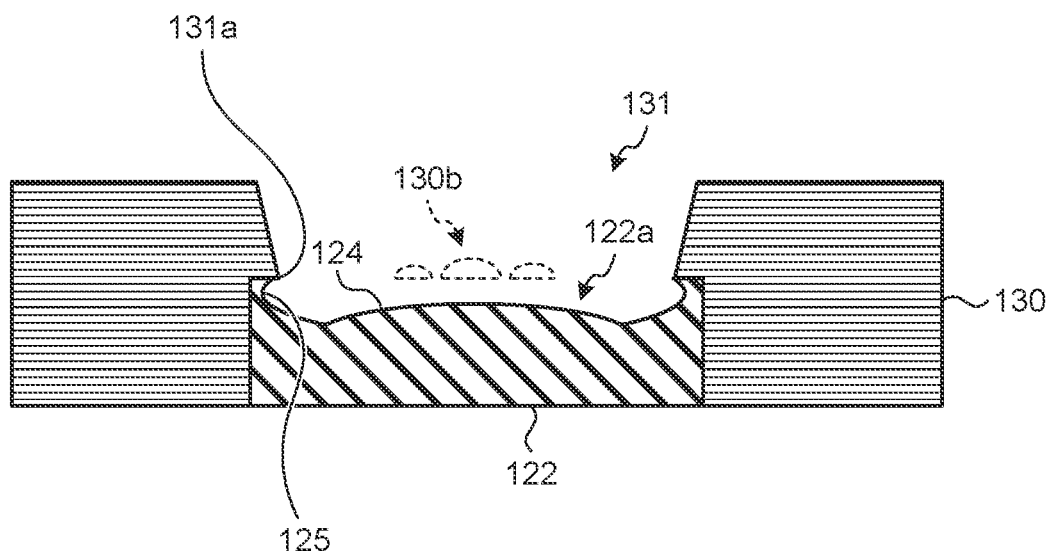
FIG. 17 is a view illustrating a specific example of a recess portion forming step.

Furthermore, for example, by adjustment of time of immersion in the etching solution, the wiring layer 122 located below the resin residue 130b is etched from the groove, and the resin residue 130b is removed and the recess portion 122a is formed in the wiring layer 122 as illustrated in FIG. 17, for example. FIG. 17 is a view illustrating a specific example of a recess portion forming step. At this time, a central portion of a bottom surface of the recess portion 122a is raised higher than an outer peripheral portion of the bottom surface toward the bottom of the opening portion 131, and forms the raised portion 124. Note that the removed resin residue 130b is indicated by a broken line in FIG. 17. The bottom of the opening portion 131 means a portion in the vicinity of a boundary between the wiring layer and an opening portion reaching the surface of the wiring layer through the insulating layer or the solder resist layer, and is, for example, the surface of the wiring layer 122 exposed from the opening portion 131 in FIG. 15. In addition, when the raised portion 124 is formed, an inner wall of the recess portion 122a is recessed outward from a periphery 131a on the bottom side of the opening portion 131, and forms a concave portion 125.

Figure 18:
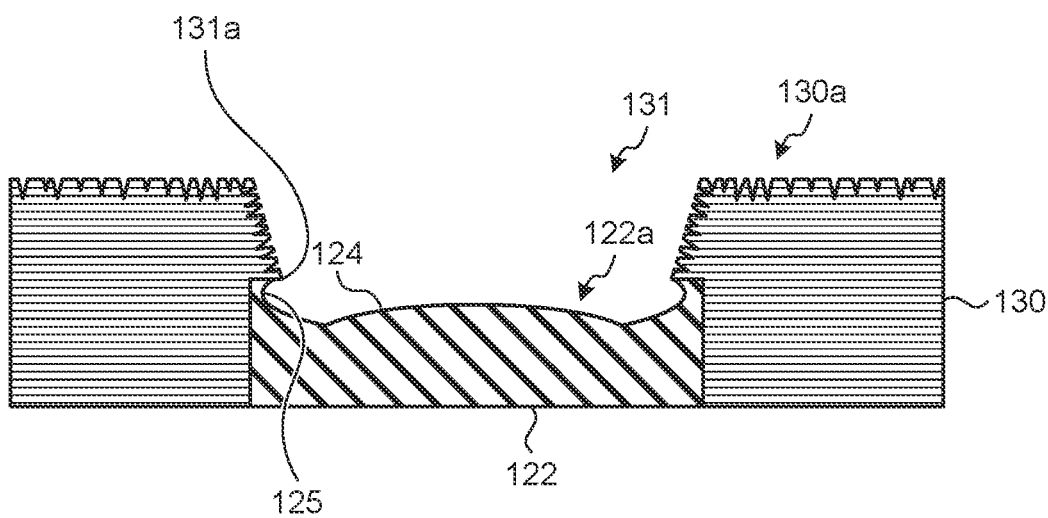
FIG. 18 is a view illustrating a specific example of a roughening treatment step.

When the recess portion 122a is formed, the surface of the solder resist layer 130 including the inner wall surface of the opening portion 131 is roughened (Step S203). Specifically, for example, as illustrated in FIG. 18, the surface of the solder resist layer 130 is roughened by, for example, dry etching using plasma or wet etching using a chemical solution. That is, a roughened surface 130a is formed on the surface of the solder resist layer 130 on the inner wall surface of the opening portion 131 and around the opening portion 131. FIG. 18 is a view illustrating a specific example of a roughening treatment step. Note that in a case where the surface of the solder resist layer 130 is roughened by dry etching using plasma, an increase in surface roughness of the roughened surface 130a is appropriately controlled. Thus, deterioration in an electrical characteristic of the connection terminal 150 formed in the solder resist layer 130 is reduced. In addition, in a case where the surface of the solder resist layer 130 is roughened by wet etching using a chemical solution, by adjustment of time of immersion in the chemical solution, an increase in the surface roughness of the roughened surface 130a is moderately controlled, and deterioration in the electrical characteristic of the connection terminal 150 is reduced.

Figure 19:
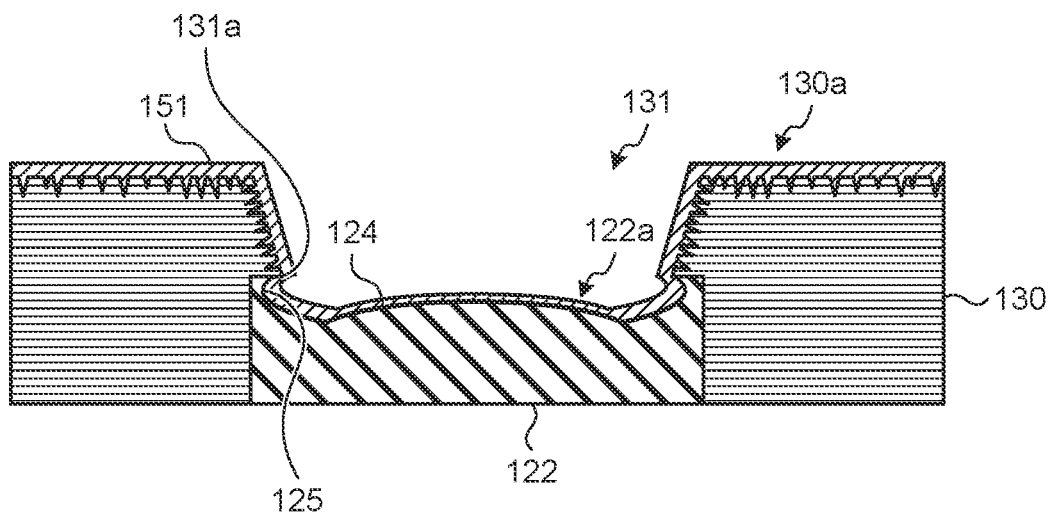
FIG. 19 is a view illustrating a specific example of an electroless plating step.

When the roughened surface 130a is formed around the opening portion 131, the seed layer 151 is formed by electroless plating (Step S204). Specifically, for example, as illustrated in FIG. 19, the seed layer 151 is formed by, for example, electroless copper plating performed on the surface of the solder resist layer 130 including the roughened surface 130a. At this time, the seed layer 151 is formed in such a manner as to cover the inner wall surface of the opening portion 131 and the bottom surface of the recess portion 122a. FIG. 19 is a view illustrating a specific example of an electroless plating step. The thickness of the seed layer 151 is, for example, about 0.5 to 1.5 lam. Note that the seed layer 151 may be formed by sputtering of metal such as copper.

Figure 20:
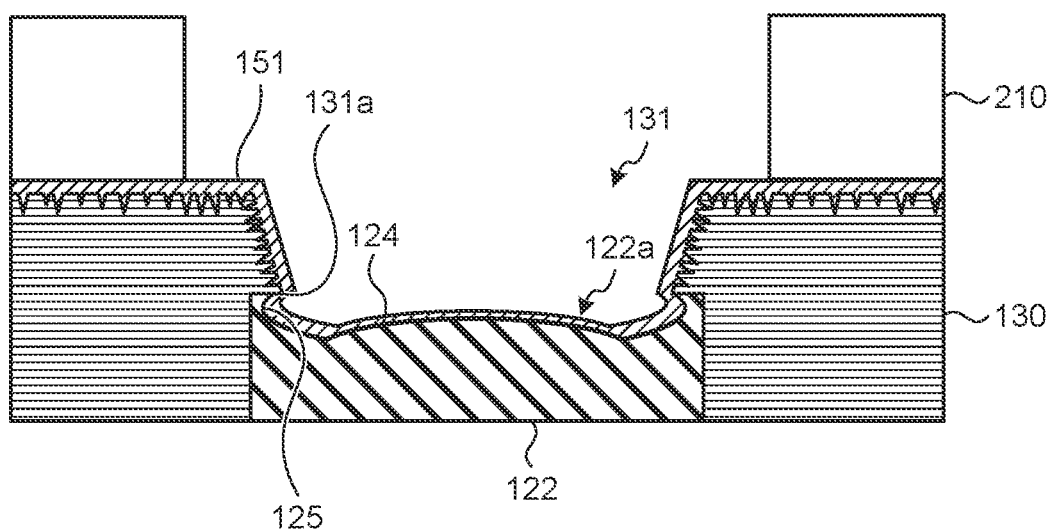
FIG. 20 is a view illustrating a specific example of a DFR layer forming step.

When the seed layer 151 is formed, a dry film resist (DFR) layer serving as a mask of electrolytic plating is formed (Step S205). That is, the DFR is laminated on the seed layer 151 and exposure and development according to a position of the connection terminal 150 is performed, whereby the DFR 210 is formed on the seed layer 151 excluding the position where the connection terminal 150 is formed, for example, as illustrated in FIG. 20. FIG. 20 is a view illustrating a specific example of a DFR layer forming step.

Figure 21:
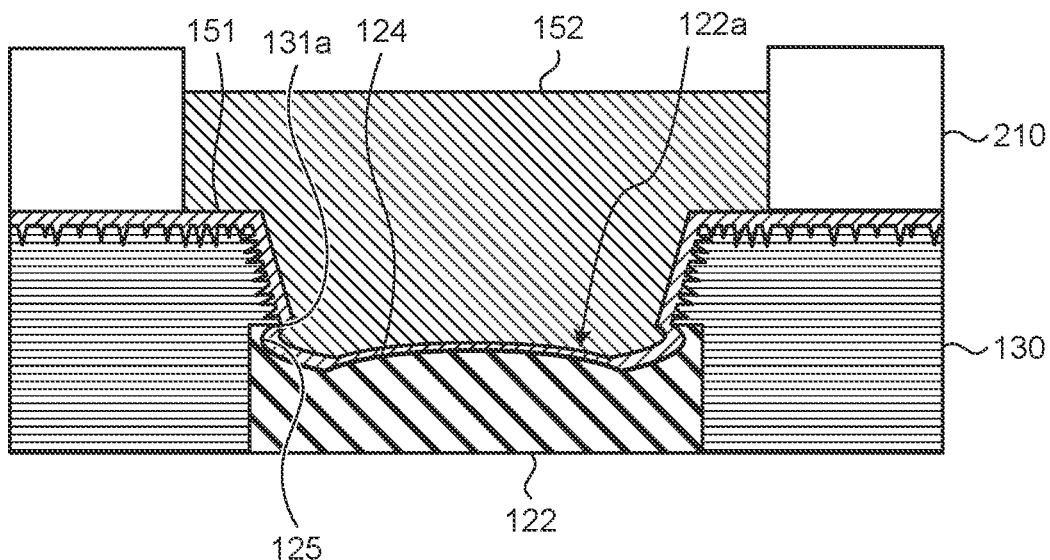
FIG. 21 is a view illustrating a specific example of an electrolytic plating step.

Then, the post 152 is formed on the seed layer 151 by electrolytic plating (Step S206). Specifically, for example, when electrolytic copper plating is performed by utilization of a copper sulfate plating solution, copper is deposited on a portion where the DFR 210 is not formed, and the post 152 that is an electrolytic plating film is formed on the seed layer 151, for example, as illustrated in FIG. 21. FIG. 21 is a view illustrating a specific example of an electrolytic plating step.

In the formation of the post 152 that is the electrolytic plating film, a plating film is deposited from the seed layer 151 on the inner wall surface of the opening portion 131, and at the same time, the plating solution enters the recess portion 122a and a plating film is deposited from the seed layer 151 on the bottom surface of the recess portion 122a toward the bottom of the opening portion 131. However, since the raised portion 124 is formed at the central portion of the bottom surface of the recess portion 122a, growth of the plating film deposited from the seed layer 151 on the bottom surface of the recess portion 122a is relatively fast. That is, since a distance from the raised portion 124 to the bottom of the opening portion 131 is short, entrance of the plating solution from the opening portion 131 to the bottom surface of the recess portion 122a is promoted, and a growth rate of the plating film deposited from the seed layer 151 on the bottom surface of the recess portion 122a increases. Thus, the plating film deposited from the seed layer 151 on the bottom surface of the recess portion 122a grows upward beyond the bottom of the opening portion 131 before the plating film deposited from the seed layer 151 on the inner wall surface of the opening portion 131 closes the opening portion 131. As a result, in the vicinity of the bottom of the opening portion 131, embeddability by the post 152 that is the electrolytic plating film is improved, and generation of a void in the post 152 is controlled.

Figure 22:
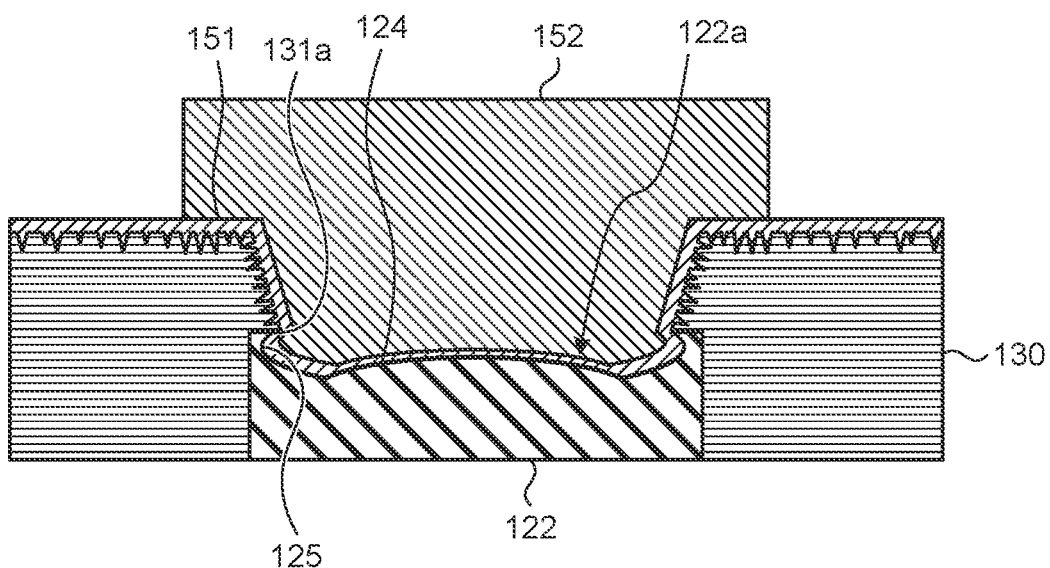
FIG. 22 is a view illustrating a specific example of a DFR layer removing step.

When the post 152 is formed, the DFR 210 is removed (Step S207). For the removal of the DFR 210, for example, caustic soda or an amine-based alkali stripping solution is used. By the removal of the DFR 210, for example, as illustrated in FIG. 22, the post 152 protrudes from the solder resist layer 130 and is connected to the wiring layer 122 via the seed layer 151. FIG. 22 is a view illustrating a specific example of a DFR layer removing step. At this stage, since the seed layer 151 remains on the entire surface and the post 152 is short-circuited with another post, it is necessary to remove an unnecessary portion of the seed layer 151 which portion does not overlap with the post 152.

Thus, the seed layer 151 is etched with the post 152 as a mask (Step S208). Specifically, the seed layer 151 formed on an upper surface of the solder resist layer 130 is immersed in, for example, an etching solution that selectively dissolves copper, and an unnecessary portion of the seed layer 151 which portion does not overlap with the post 152 is removed. As a result, the connection terminal 150 connected to the wiring layer 122 and including the seed layer 151 and the post 152 is formed.

At this stage, a lower portion of the post 152 is formed in a state in which generation of a void is controlled in the vicinity of the bottom of the opening portion 131. Thus, the connection terminal 150 is securely fixed to the inner wall surface of the opening portion 131 of the solder resist layer 130 and the bottom surface of the recess portion 122a of the wiring layer 122, and connection reliability between the connection terminal 150 and the wiring layer 122 can be improved.

As described above, a wiring board according to an embodiment (such as wiring board 100) has a wiring layer (such as wiring layers 113 and 122), an insulating layer (such as insulating layer 121 and solder resist layer 130), and an opening portion (such as opening portions 121b and 131). In addition, the wiring board has a recess portion (such as recess portions 113a and 122a) and a conductor film (such as via wiring line 123 and connection terminal 150). The insulating layer is laminated on the wiring layer. The opening portion penetrates through the insulating layer to the wiring layer. The recess portion is formed on a surface of the wiring layer exposed from the opening portion of the insulating layer. The conductor film is formed in the opening portion of the insulating layer and the recess portion of the wiring layer. Then, the recess portion of the wiring layer has, at a central portion of a bottom surface, a raised portion raised higher than an outer peripheral portion of the bottom surface toward a bottom of the opening portion (such as raised portions 114 and 124). Thus, the wiring board according to the embodiment can improve connection reliability.

In addition, the conductor film may include a first conductor film covering an inner wall surface of the opening portion and the bottom surface of the recess portion (such as seed layers 151 and 122b), and a second conductor film laminated on the first conductor film (such as post 152 and electrolytic plating layer 122c). As a result, the wiring board according to the embodiment can improve connection reliability between the wiring layer and a via wiring line and a connection terminal made of a multilayer conductor film.

In addition, the insulating layer may have a roughened surface (such as roughened surfaces 121a and 130a) on a surface including the inner wall surface of the opening portion covered with the conductor film. Thus, the wiring board according to the embodiment can improve adhesion between the conductor film and the insulating layer.

Furthermore, the top of the raised portion may be located below the bottom of the opening portion. Thus, the wiring board according to the embodiment can improve connection reliability.

In addition, the recess portion of the wiring layer may have, in an inner wall, a concave portion (such as concave portions 115 and 125) recessed outward from a periphery (such as periphery 131a) on the bottom side of the opening portion. Thus, the wiring board according to the embodiment can further improve the connection reliability.

In addition, the conductor film may be connected to the wiring layer and protrude from the opening portion of the insulating layer to form a connection terminal (such as connection terminal 150). Thus, the wiring board according to the embodiment can improve connection reliability between the connection terminal and the wiring layer.

In addition, the conductor film may form a via wiring line that connects the wiring layer and another wiring layer that is formed on the insulating layer (such as via wiring line 123). Thus, the wiring board according to the embodiment can improve connection reliability between the via wiring line and the wiring layer.

Modification Example

Figure 23:
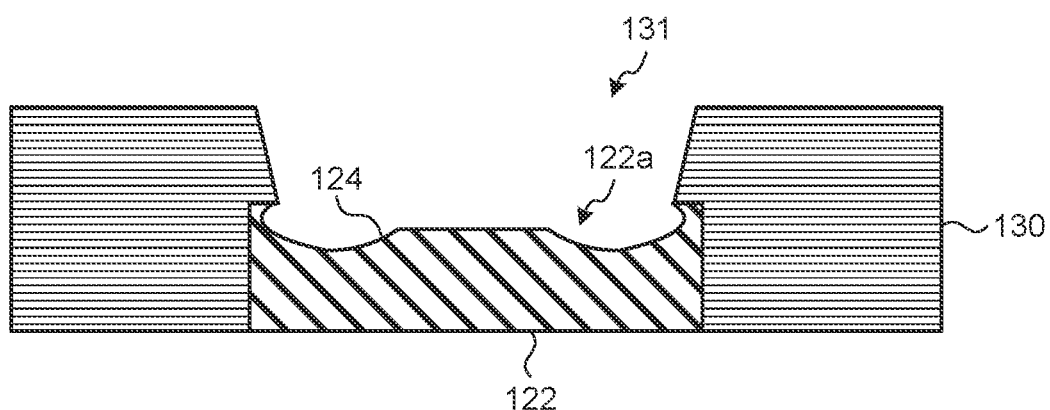
FIG. 23 is a view illustrating a raised portion according to a first modification example.

Note that although it is assumed in the above embodiment that the top of the raised portion 124 of the recess portion 122a is rounded, a shape of a top of a raised portion 124 is not limited thereto. For example, as illustrated in FIG. 23, the top of the raised portion 124 may be a flat surface. FIG. 23 is a view illustrating a raised portion 124 according to a first modification example. Since the top of the raised portion 124 of a recess portion 122a is a flat surface, supply of a plating solution to a seed layer 151 on a bottom surface of the recess portion 122a is promoted when a post 152 is formed on the seed layer 151 by electrolytic plating. As a result, the vicinity of a bottom of an opening portion 131 is quickly filled with electrolytic plating, and generation of a void at a root of a connection terminal 150 can be further controlled.

Figure 24:
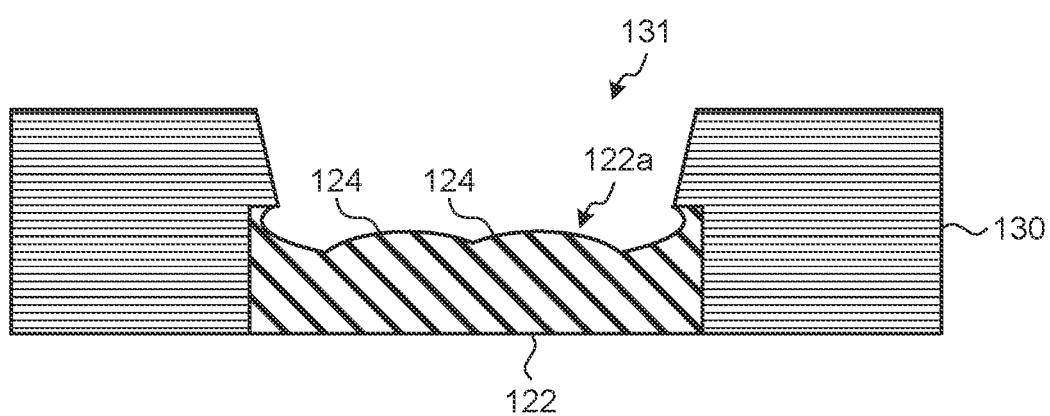
FIG. 24 is a view illustrating a raised portion according to a second modification example.

In addition, although it is assumed in the above embodiment that one raised portion 124 is formed at the central portion of the bottom surface of the recess portion 122a, the number of raised portions 124 is not limited to one. For example, as illustrated in FIG. 24, a recess portion 122a of a wiring layer 122 may have a plurality of (two in an example of FIG. 24) raised portions 124 at a central portion of a bottom surface. FIG. 24 is a view illustrating a raised portion 124 according to a second modification example. Since a plurality of raised portions 124 is formed at a central portion of a bottom surface of a recess portion 122a, supply of a plating solution to a seed layer 151 on the bottom surface of the recess portion 122a is promoted when a post 152 is formed on the seed layer 151 by electrolytic plating. As a result, the vicinity of a bottom of an opening portion 131 is quickly filled with electrolytic plating, and generation of a void at a root of a connection terminal 150 can be further controlled.

Furthermore, the wiring board 100 in which the solder resist layer 130 is formed of a non-photosensitive thermosetting resin has been described as an example in the above embodiment. However, the present invention may be applied to a wiring board in which a solder resist layer 130 is formed of a photocurable resin.

According to one aspect of a wiring board disclosed in the present application, it is possible to improve connection reliability.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

Note (1) A manufacturing method of a wiring board, the method comprising:
  a step of laminating an insulating layer on a wiring layer;
  a step of forming, in the insulating layer, an opening portion penetrating to the wiring layer;
  a step of forming a recess portion in a surface of the wiring layer exposed from the opening portion of the insulating layer; and
  a step of forming a conductor film in the opening portion of the insulating layer and the recess portion of the wiring layer by plating, wherein
  the step of forming the recess portion includes forming the recess portion having a raised portion, which is raised higher than an outer peripheral portion of a bottom surface of the recess portion, in a central portion of the bottom surface.

(2) The manufacturing method of a wiring board according to the note (1), wherein
  the step of forming the opening portion includes forming the opening portion by irradiating the insulating layer with a laser and making a residue of the insulating layer remain in a central portion of a surface of the wiring layer exposed from the opening portion, and
  the step of forming the recess portion includes:
    selectively etching an outer peripheral portion of the surface of the wiring layer with the residue as a mask to form a groove lower than the central portion of the surface of the wiring layer in the outer peripheral portion of the surface of the wiring layer; and
    further etching the wiring layer located below the residue from the groove to remove the residue and form the recess portion.

(3) The manufacturing method of a wiring board according to the note (2), wherein
  the laser has an intensity distribution in which intensity at a central portion is lower than intensity at an outer peripheral portion in a direction along a beam diameter of the laser.

(4) The manufacturing method of a wiring board according to the note (1), further comprising
  a step of roughening a surface of the insulating layer including an inner wall surface of the opening portion after the step of forming the recess portion and before the step of forming the conductor film.

What is claimed is:

1. A wiring board comprising:
  a wiring layer;
  an insulating layer laminated on the wiring layer;
  an opening portion penetrating through the insulating layer to the wiring layer;
  a recess portion formed on a surface of the wiring layer exposed from the opening portion of the insulating layer; and
  a conductor film formed in the opening portion of the insulating layer and the recess portion of the wiring layer, wherein
  the recess portion of the wiring layer has a raised portion, which is raised higher than an outer peripheral portion of a bottom surface of the raised portion, at a central portion of the bottom surface, and
  a top of the raised portion is located below a bottom of the opening portion and a surface of the wiring layer not exposed from the opening portion.

2. The wiring board according to claim 1, wherein the conductor film includes:
  a first conductor film covering an inner wall surface of the opening portion and the bottom surface of the recess portion; and
  a second conductor film laminated on the first conductor film.

3. The wiring board according to claim 2, wherein the second conductor film is filled in the opening portion to fill up the opening portion.

4. The wiring board according to claim 1, wherein the insulating layer has a roughened surface on a surface including an inner wall surface of the opening portion covered with the conductor film.

5. The wiring board according to claim 1, wherein a top of the raised portion is a flat surface.

6. The wiring board according to claim 1, wherein the recess portion of the wiring layer includes, in an inner wall, a concave portion recessed outward from a periphery on a side of the bottom of the opening portion.

7. The wiring board according to claim 1, wherein the recess portion of the wiring layer includes a plurality of the raised portions at the central portion of the bottom surface.

8. The wiring board according to claim 1, wherein the conductor film forms a connection terminal connected to the wiring layer and protruding from the opening portion of the insulating layer.

9. The wiring board according to claim 1, wherein the conductor film forms a via wiring line that connects the wiring layer and another wiring layer that is formed on the insulating layer.

10. The wiring board according to claim 1, wherein the raised portion has a crest shape continuously raised from the outer peripheral portion of the bottom surface toward the central portion of the bottom surface.

11. A wiring board comprising:
a wiring layer;
an insulating layer laminated on the wiring layer;
an opening portion penetrating through the insulating layer to the wiring layer;
a recess portion formed on a surface of the wiring layer exposed from the opening portion of the insulating layer; and
a conductor film formed in the opening portion of the insulating layer and the recess portion of the wiring layer, wherein
the recess portion of the wiring layer has a raised portion, which is raised higher than an outer peripheral portion of a bottom surface of the raised portion, at a central portion of the bottom surface, and
the recess portion of the wiring layer includes, in an inner wall, a concave portion recessed outward from a periphery on a side of the bottom of the opening portion.

12. The wiring board according to claim 11, wherein the conductor film includes:
a first conductor film covering an inner wall surface of the opening portion and the bottom surface of the recess portion; and
a second conductor film laminated on the first conductor film.

13. The wiring board according to claim 12, wherein the second conductor film is filled in the opening portion to fill up the opening portion.

14. The wiring board according to claim 11, wherein the insulating layer has a roughened surface on a surface including an inner wall surface of the opening portion covered with the conductor film.

15. The wiring board according to claim 11, wherein a top of the raised portion is a flat surface.

16. The wiring board according to claim 11, wherein the recess portion of the wiring layer includes a plurality of the raised portions at the central portion of the bottom surface.

17. The wiring board according to claim 11, wherein the conductor film forms a connection terminal connected to the wiring layer and protruding from the opening portion of the insulating layer.

18. The wiring board according to claim 11, wherein the conductor film forms a via wiring line that connects the wiring layer and another wiring layer that is formed on the insulating layer.

19. The wiring board according to claim 11, wherein the concave portion is recessed to an outside in a radial direction of the opening portion more than the periphery on the side of the bottom of the opening portion and has a width getting smaller along a depth direction.

20. The wiring board according to claim 11, wherein the raised portion has a crest shape continuously raised from the outer peripheral portion of the bottom surface toward the central portion of the bottom surface.

* * * * *